United States Patent [19]

Chung

[11] Patent Number: 4,714,839
[45] Date of Patent: Dec. 22, 1987

[54] CONTROL CIRCUIT FOR DISABLING OR ENABLING THE PROVISION OF REDUNDANCY

[75] Inventor: Shine C. Chung, San Jose, Calif.

[73] Assignee: Advanced Micro Devices, Inc., Sunnyvale, Calif.

[21] Appl. No.: 844,927

[22] Filed: Mar. 27, 1986

[51] Int. Cl.$^4$ ................... H03K 19/03; H03K 19/096
[52] U.S. Cl. ........................ 307/441; 365/96; 365/200; 307/219; 307/303
[58] Field of Search ............. 307/441, 219, 303; 365/200, 96; 371/8–10, 11

[56] References Cited

U.S. PATENT DOCUMENTS

| 4,546,454 | 10/1985 | Gupta et al. | 365/200 |
| 4,606,013 | 8/1986 | Yoshimoto | 365/200 |
| 4,613,959 | 9/1986 | Jiang | 365/200 |
| 4,621,346 | 11/1986 | McAdans | 365/227 |
| 4,651,030 | 3/1987 | Mimoto | 307/441 |

OTHER PUBLICATIONS

IBM Technical Disclosure Bulletin, "Reversible On-Chip Redundancy Scheme", by W. Chin and J. A. Parisi, vol. 14, No. 10, Mar. 1972.

Primary Examiner—Stanley D. Miller
Assistant Examiner—Richard Roseen
Attorney, Agent, or Firm—Patrick T. King; Davis Chin

[57] ABSTRACT

A logic circuit for activating and deactivating redundant elements include a high-low-high circuit and a dynamic latch coupled to the output of the high-low-high circuit for activating the redundant elements in response to true and complement address signals. The high-low-high circuit includes a first fuse which is blown so as to enable the redundant elements and a second fuse which is blown to disable the redundant elements.

12 Claims, 3 Drawing Figures

CONTROL CIRCUIT FOR DISABLING OR ENABLING THE PROVISION OF REDUNDANCY

BACKGROUND OF THE INVENTION

This invention relates generally to logic or memory circuits for producing a redundancy and more particularly, it relates to a high-low-high circuit whose output can become low by blowing a redundant enable fuse and can become high again by blowing a redundant disable fuse for indirect redundancy wherein spare rows or columns of memory elements in a memory array are substituted in place of faulty rows or columns.

In recent years, there has arisen the need of manufacturing semiconductor memories in which a memory array of elements have a very high density. As the density of the memory array on a semiconductor chip increases, it becomes a significantly more difficult task to produce perfect semiconductor memory chips. In an effort to improve production yields and memory chip reliability, redundant memory elements or bits in the form of additional rows or columns in the memory array have been included on the semiconductor chip. The semiconductor memory may be checked when it is still in a semiconductor wafer form joined to other semiconductor memory chips to determine whether its operates properly. If a faulty area is located, extra memory circuits can then be substituted for the defective elements in this faulty area on the primary memory array of memory elements.

Heretofore, there are many known existing circuits which implement the substitution of memory elements in a memory array so as to perform the necessary repairs of the faulty memory elements. One of these prior art circuits require the use of a high number of circuit components and has a very complex arrangement with a power-up reset network. As a result, this circuit suffers from the disadvantage of high power consumption. Another prior art circuit is implemented by the use of a number of pass gates which have the inherent problems of undershoot and overshoot due to parasitic capacitances. Thus, such circuit using pass gates are susceptible to a latch-up condition.

It would therefore be desirable to provide a logic circuit for activating and deactivating redundant elements in which the logic circuit utilizes a relatively few number of components. The logic circuit of the present invention includes a high-low-high circuit which enables a redundant element by blowing a first fuse and disabling the redundant element by blowing a second fuse. This technique utilizes a dynamic latch which consumes no DC current so as to reduce power consumption.

SUMMARY OF THE INVENTION

Accordingly, it is the general object of the present invention to provided a high-low-high circuit for activating and deactivating redundant elements which is relatively simple and economical to manufacture and assemble, but yet overcomes the disadvantages of the prior art circuits.

It is an object of the present invention to provide a high-low-high circuit for activating and deactivating a redundant element which utilizes a relatively few number of components.

It is another object of the present invention to provide a high-low-high circuit for activating and deactivating a redundant element and a dynamic latch which consumes no DC current so as to reduce power consumption.

It is still another object of the present invention to provide a high-low-high circuit which enables a redundant element by blowing a first fuse and by disabling the redundant element by blowing a second fuse.

It is still yet another object of the present invention to provide a logic circuit for activating and deactivating redundant elements which includes a high-low-high circuit formed of a pair of fuses and a dynamic latch means coupled to the output of the high-low-high circuit for activating the redundant element in response to address signals.

In accordance with these aims and objectives, the present invention is concerned with the provisions of a logic circuit formed of a high-low-high circuit for activating and deactivating off redundant elements which includes a NOR gate, an enable fuse, an inverter, a disable fuse, and a P-channel MOS transistor. The NOR gate has two inputs and an output. The enable fuse has a first end connected to the output of the NOR gate and a second end connected to a ground potential. The inverter has its input connected to the first end of the enable fuse. The disable fuse has a first end connected to the output of the inverter and a second end connected to an output node. The transistor has its source connected to a supply potential, its gate connected to the ground and its drain connected to the output node.

In operation, the output node is at a high logic level when the enable and disable fuses are not blown. By blowing the enable fuse, the output node is switched to a low logic level for enabling the use of the redundant elements. By blowing subsequently the disable fuse, the output node is switched back to the high logic level for disabling the use of the redundant elements.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
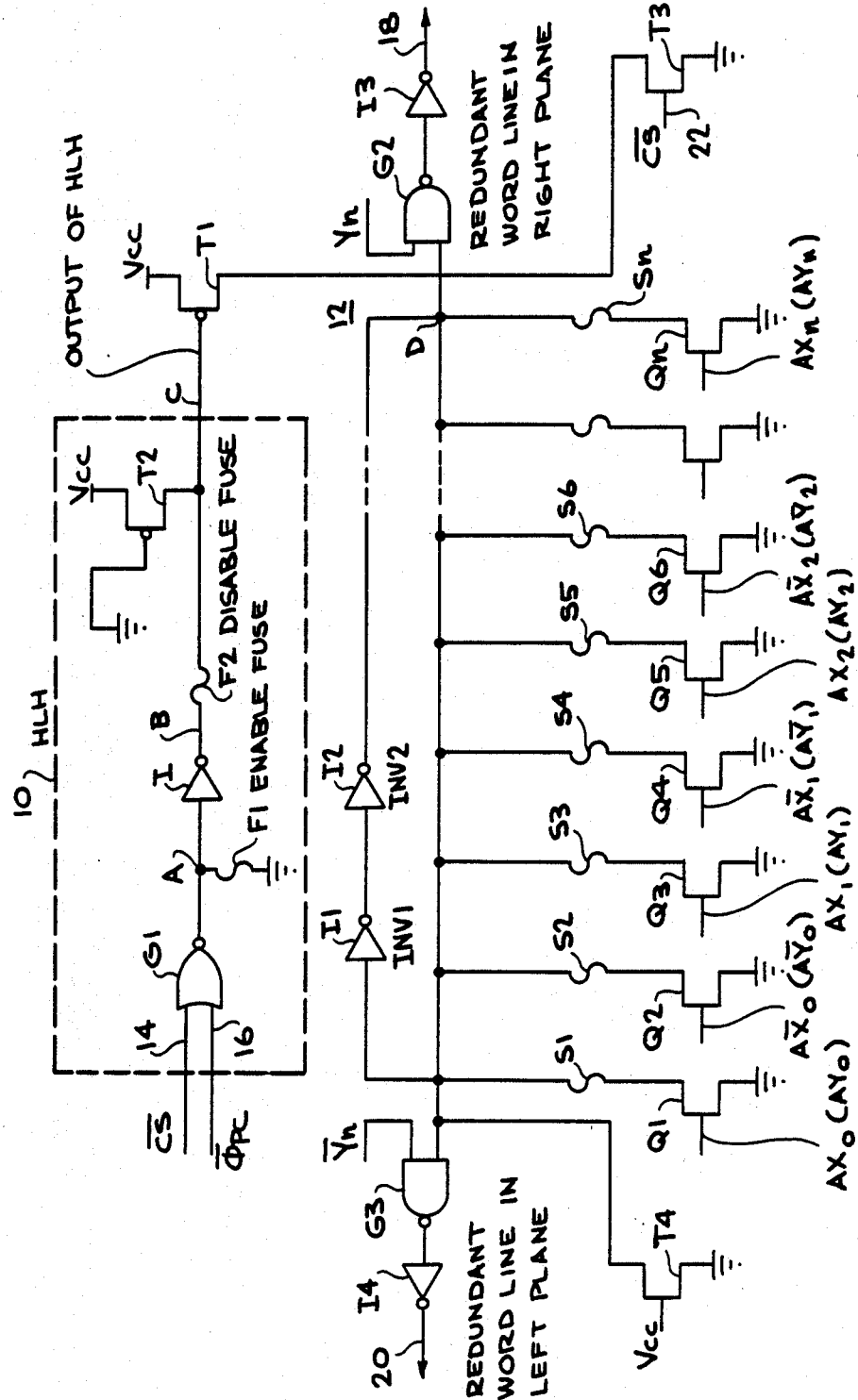
FIG. 1 is a schematic circuit diagram of a logic circuit of the present invention.

Referring now in detail to the drawings, there is shown in FIG. 1 a schematic circuit diagram of a logic circuit formed of a high-low-high circuit 10 and a dynamic latch portion 12 for activating and deactivating a redundant element (not shown). The high-low-high circuit 10 comprises a two-input NOR gate G1, an enable fuse F1, an inverter I, a disable fuse F2 and a pull-up P-channel MOS transistor T2. The NOR gate G1 has one input on line 14 which receives a complement of a chip select signal CS. The other input on line 16 of the gate G1 is from a complement of a precharging pulse signal $\phi_{pc}$. The output of the gate G1 is coupled to the input of the inverter I and to one end of the enable fuse F1. The other end of the enable fuse F1 is connected to a ground potential. The output of the inverter I is connected to one end of the disable fuse F2. The other end of the disable fuse F2 defining the output of the high-low-high circuit 10 is connected to the drain of the pull-up P-channel transistor T2. The fuses F1 and F2 may, for example, be metal, silicide or a semiconductor such as polysilicon material which may be opened or blown by the use of a laser cut. The gate of the pull-up transistor T2 is connected to the ground potential, and the source of the transistor T2 is tied to a supply voltage or potential VCC which is typically +5.0 volts for MOS circuitry. Thus, the transistor T2 is always rendered to be conductive. The purpose of the transistor T2 is to maintain the drain thereof (gate of transistor T1) from being at a floating potential when both of the fuses F1 and F2 are blown. Therefore, the transistor T2 is usually designed to be of a small size.

The dynamic latch portion 12 includes a switching P-channel MOS transistor T1, a chip select N-channel MOS transistor T3, two-input NAND gate G2, a two-input NAND gate G3, and inverters I1, I2, I3 and I4. The gate of the switching transistor T1 is connected to the output of the high-low-high circuit 10. The source of the switching transistor T1 is connected to the supply potential VCC. The drain of the switching transistor is connected to the drain of the N-channel transistor T3, to one input of the NAND gate G2, and to one input of the NAND gate G3. The other input of the gate G2 receives a true address signal $Y_n$. The output of the gate G2 is connected to the input of the inverter I3. The output of the inverter I3 is connected to a redundant word line 18 in the right plane which is connectable to an array of redundant cell elements in the right half-plane. The other input of the gate G3 receives a complement address signal $\overline{Y}_n$. The output of the gate G3 is connected to the input of the inverter I4. The output of the inverter I4 is connected to a redundant word line 20 in the left plane which is connectable to an array of redundant cell elements in the left half-plane.

It should be understood that the gate G3 and the inverter I4 are identical in function to the gate G2 and the inverter I3. These gates and inverters are utilized to control spare rows in the respective right and left half-planes. If it is desired to provide redundant columns, only the gate G2 and the inverter I3 are required. The address signals $Y_n$ and $\overline{Y}_n$ are used to select either the right or left half-plane when redundant rows are provided.

The inverter I1 has its output connected to the input of the inverter I2, and the output of the inverter I2 is connected to the input of the inverter I1. The output of the inverter I2 is also connected to the drain of the chip select transistor T3. The inverters I1 and I2 form a dynamic latch. The gate of the transistor T3 is connected to a line 22 which receives the complement of the chip select CS. The source of the transistor T3 is connected to the ground potential.

The dynamic latch portion 12 further includes a plurality of transistors Q1, Q2, ... Qn whose sources are connected to the ground potential. The drains of the transistors Q1, Q2, ... Qn are connected via respective fuses S1, S2, ... Sn to the one input of the NAND gates G2 and G3. True and complement address signals $AX_o$, $\overline{AX}_o$, $AX_1$, $\overline{AX}_1$, ... $AX_n$, $\overline{AX}_n$ for row redundancy or true and complement address signals $AY_o$, $\overline{AY}_o$, $AY_1$, $\overline{AY}_1$, ... $AY_n$, $\overline{AY}_n$ for column redundancy are applied to the respective gates of the transistors Q1, Q2, ... Qn. Selected ones of the fuses S1, S2, ... Sn associated with each true or complement addresses are blown during programming so as to be responsive to a particular address which is faulty and is to be replaced by the redundant elements. For example, if $AX_o=1$, $AX_1=0$, and $AX_2=1$ is the row address that is faulty then the fuses S1, S4, and S5 associated with the address signals $AX_o$, $\overline{AX}_1$, and $AX_2$ are the one required to be blown.

For explaining the operation of the logic circuit of FIG. 1, reference is made to the waveforms shown in FIG. 2(a) through 2(e). Initially, it will be noted that if a semiconductor memory tested at the wafer stage or before being packaged is found to contain no faulty elements or bits in the rows or columns of the memory array, there will be no need to substitute the primary memory array with the spare (redundant) row or column bits. If this is indeed the case none of the fuses F1, F2 and S1–Sn will be made to be blown or opened. As a result, the output of the NOR gate G1 at node A will be held at a low or ground potential by the enable fuse F1 regardless of input signals $\overline{CS}$ and $\phi_{pc}$ applied to the respective input lines 14 and 16. Therefore, the output of the high-low-high circuit 10 at node C at the gate of the switching transistor T1 will be maintained at a high potential. Consequently, the switching transistor T1 will be rendered non-conductive.

In one type of memory access called chip select access, the chip select signal $\overline{CS}$ will be at a logic "1" if a chip is deselected so as to cause the transistor T3 to be rendered conductive. Thus, node D will be held at a low potential. When the chip is selected and the address signals match the addresses of the blown fuses, the select signal $\overline{CS}$ is switched from the logic "1" level to a logic "0" level indicating a read or write operation, the transistor T3 will be turned off but the node D will be latched still at a low potential by the latch formed by the inverters I1 nd I2. Since the switching transistor T1 is maintained in the off condition, the input signals will not alter the low potential at the node D. As a result, both of the address signals $Y_n$ and $\overline{Y}_n$ (one of which will be at a high level) are prevented from passing through the respective NAND gates G2 and G3. Therefore, the outputs of the inverters I3 and I4 on the respective lines 18 and 19 will be low so that the redundancy row (column) elements in the left and right planes will not be used.

When the semiconductor memory is tested and a particular row (column) in the primary memory array has been determined to be faulty, it will be necessary to substitute a spare row in place of a faulty row so as to make the semiconductor memory useful. This is achieved by opening or blowing the enable fuse F1 and certain ones of the fuses S1–Sn by a laser cut. If the address signals do not match the redundant address of the programmed fuses, at least one of the transistors Q1, Q2, ... Qn will be turned on. This will cause the node D to be at the ground potential and thus the redundant element will not be selected. For the following discussion, it will be assumed that the redundant address is selected by the address signals.

Figure 2:
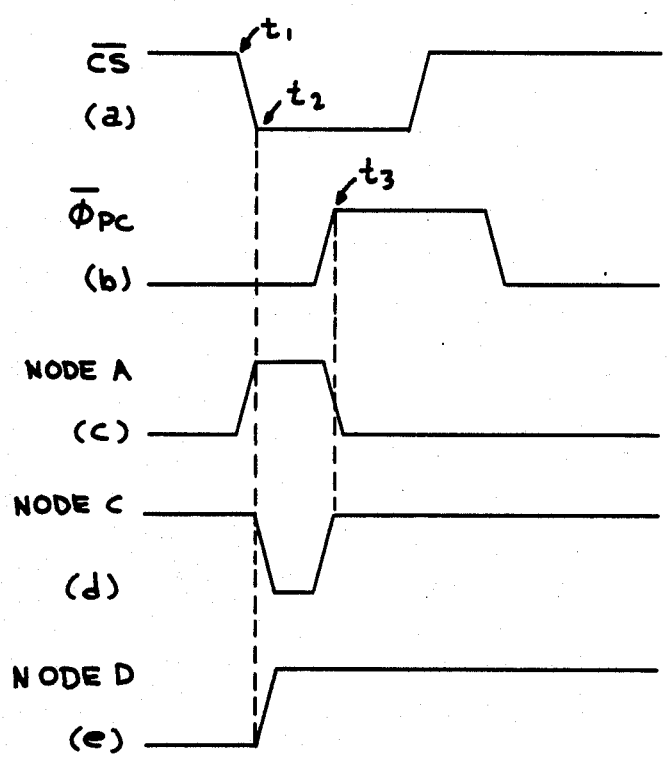
FIGS. 2(a)–2(e) are waveforms useful in understanding the chip select access operation of FIG. 1.

Referring to FIG. 2(a), the chip select signal CS will normally be at a high or "1" logic level such as at time t1. When a read or write operation to be performed, the chip select signal $\overline{CS}$ will be switched to a low or "0" logic level such as at time t2. This causes the transistor T3 to be turned off and the node D will be initially at a low potential. The precharging pulse signal $\phi_{pc}$ in FIG. 2(b) consist of a delayed pulse which is in response to the chip select signal $\overline{CS}$ switching from the logic "1" level to the logic "0" level. As can be seen at the time t3, the precharging pulse signal $\bar{\phi}_{pc}$ will be switched from a logic "0" to a logic "1" level.

With these two input signals $\overline{CS}$ and $\bar{\phi}_{pc}$ applied to the two input lines 14 and 16 of the NOR gate G1, the output of the gate G1 at node A is produced which is shown in FIG. 2(c). The output of the gate G1 is inverted by the inverter I. The output of the high-low-high circuit at the node C is shown in FIG. 2(d). It will be noted that only between the times t2 and t3 is the potential at the node C at a low level. At this time interval between the times t2 and t3, the switching transistor T1 will be turned on so as to pull the potential at the node D (FIG. 2e) to a high level near the supply potential VCC. The inverters I1 and I2 act as a dynamic latch so as to maintain the node D at the high level even after the precharging pulse $\bar{\phi}_{pc}$ is gone. The advantages of using a dynamic latch should be apparent. Firstly, no DC power is consumed by the dynamic latch since it is triggered by a pulse signal. Secondly, the switching transistor T1 can be made of a very large size for fast turn-on since it only consumes power for a very short time. If the address signal $Y_n$ is at a logic "1" level, the output of the gate G2 will be pulled to a low potential. This low potential is inverted to a high potential on the control line 18 by the inverter I3 so as to permit use of the redundant row (column) element in the right plane. On the other hand, if the address signal $\overline{Y}_n$ is at a logic "1" level, the output of the gate G3 will be pulled to a low potential. This low potential from the gate G3 is inverted to a high potential on the control line 20 by the inverter 14 so as to permit use of the redundant row (column) element in the left plane.

Figure 3:
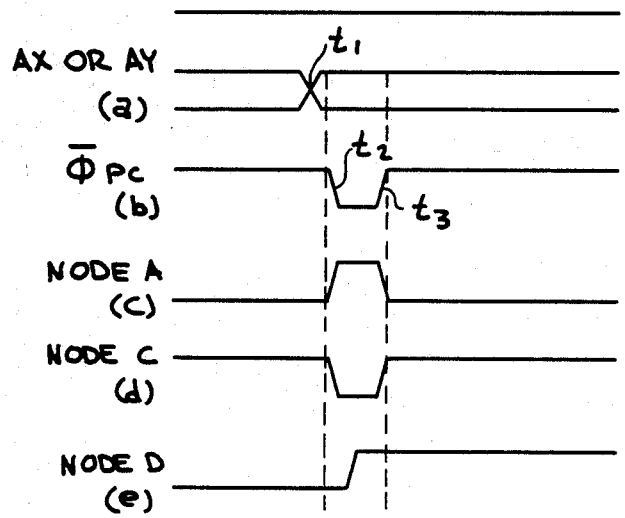
FIGS. 3(a)–3(e) are waveforms useful in understanding the address access operation of FIG. 1.

Referring now to FIGS. 3(a)–3(e), there are illustrated waveforms for the operation of another type of memory access called address access. In this address access type, the chip select signal $\overline{CS}$ will always be at a low or "0" logic level. Memory access occurs when either one or multiple address signals are switched such as at the time t1 in FIG. 3(a). This switching is sensed by an address transition detection circuit which generates a precharging pulse signal $\bar{\phi}_{pc}$. As can be seen in FIG. 3(b), the pulse signal $\bar{\phi}_{pc}$ is switched from a logic "1" level to the logic "0" level at the time t2 and is switched back to the logic "1" level at the time t3. With this input signal $\bar{\phi}_{pc}$ applied to the input line 16 of the NOR gate G1 and the input line 14 being held at the logic "0" level, the waveforms at the nodes A, C and D are shown in FIGS. 3(c), 3(d) and 3(e) respectively. It will be noted that these waveforms in FIGS. 3(c), 3(d) and 3(e) correspond identically to the respective waveforms in FIGS. 2(c), 2(d) and 2(e). Thus, the pulse signal $\bar{\phi}_{pc}$ of FIG. 3(b) will trigger the dynamic latch in the same way as described previously.

If it is determined subsequently that the spare rows or redundant elements in the right plane or left plane selected for replacing of the faulty elements were not in the proper choice, the selected redundant elements may now be disabled. This is achieved by opening or blowing of the disabled fuse F2 by a laser cut. As can be seen from FIG. 1, when the disable fuse F2 is also opened, the node C will be at a high potential near the supply potential VCC due to the pull-up transistor T2 which is always rendered conductive. Since the switching transistor T1 will be turned off, the node D will be maintained at a low potential so that the address signals $Y_n$ and $\overline{Y}_n$ are prevented from enabling the use of the redundant elements in either the right or left planes.

It should be noted that an N-channel MOS transistor T4 has its drain connected to the one input of the gates G2 and G3, its source connected to the ground potential, and its gate connected to the supply potential. The transistor T4 is referred to as leaker and provides a path to ground when the disable fuse F2 is blown and the redundant address of the programmed fuses is selected. Thus, the transistor is designed usually to be of a very small size.

From the foregoing detailed description, it can thus be seen that the present invention provides a logic circuit for activating and deactivating redundant elements which includes a first fuse which is blown so as to enable redundant elements and a second fuse which is blown so as to disable the redundant elements. Further, the logic circuit of the present invention is formed of a relatively few number of circuit components and no DC current is consumed by a dynamic latch so as to reduce power consumption.

While there has been illustrated and described what is at present to be considered a preferred embodiment of the present invention, it will be understood by those skilled in art that various changes and modifications may be made, and equivalents may be substituted for elements thereof without departing from the true scope of the invention. In addition, many modifications may be made to adapted a particular situation or material to the teachings of the invention without departing from the central scope thereof. Therefore, it is intended that this invention not be limited to the particular embodiment disclosed as the best mode contemplated for carrying out this invention, but that the invention will include all embodiments falling within the scope of the appended claims.

What is claimed is:

1. A logic circuit formed of a high-low-high circuit for activating and deactivating redundant elements comprising:

a NOR gate having two inputs and an output, said NOR gate having one input connected to receive a chip select signal and the other input connected to receive a precharging pulse signal;

an enable fuse having a first end connected to the output of said NOR gate and a second end connected to a ground potential;

an inverter having an input and an output, the input of said inverter being connected to the first end of said enable fuse;

a disable fuse having a first end connected to the output of said inverter and a second end connected to an output node;

a P-channel MOS transistor having its source connected to a supply potential, its gate connected to the ground potential, and its drain connected to the output node;

said output node being in a high logic level when said enable and disable fuses are not blown or opened, said output node being switched to a low logic level when said enable fuse is blown, and said output node being switched back to the high logic level when said enable and disable fuses are blown; and dynamic latch means being coupled to the output node for activating the redundant elements in response to true and complement address signals.

2. A logic circuit as claimed in claim 1, wherein said enable fuse is formed of a polysilicon material, silicide or metal.

3. A logic circuit as claimed in claim 2, wherein said enable fuse is blown by a laser cut.

4. A logic circuit as claimed in claim 1, wherein said disable fuse is formed of a polysilicon material, silicide or metal.

5. A logic circuit as claimed in claim 4, wherein said disable fuse is blown by a laser cut.

6. A logic circuit for activating and deactivating redundant elements comprising:

(a) high-low-high circuit means including:

a NOR gate having two inputs and an output; said NOR gate having one input connected to receive a chip select signal and the other input connected to receive a precharging pulse signal;

an enable fuse having a first end connected to the output of said NOR gate and a second end connected to a ground potential;

a first inverter having an input and an output, the input of said first inverter being connected to the first end of said enable fuse;

a disable fuse having a first end connected to the output of said first inverter and a second end connected to an output node; and a P-channel MOS transistor having its source connected to a supply potential, its gate connected to the ground potential, and its drain connected to the output node;

(b) dynamic latch means including:

a second P-channel MOS transistor having a source connected to the supply potential, a gate connected to the drain of said first P-channel MOS transistor, and a drain;

an N-channel MOS transistor having its drain connected to the drain of said second P-channel MOS transistor, its gate connected to the chip select input signal and its source connected to the ground potential;

a second inverter having an input and an output;

a third inverter having an input and an output, said third inverter having its input connected to the output of said second inverter and its output connected to the input of said second inverter so as to form a latch, the output of said third inverter being further connected to the drain of said N-channel transistor;

a first NAND gate having two inputs and an output, said first NAND gate having its first input connected to the drain of said N-channel transistor and its second input connected to a true address signal;

a fourth inverter having an input and an output, the input of said fourth inverter being connected to the output of said first NAND gate and the output of said fourth inverter being connected to a redundant element control line in a right plane;

a second NAND gate having two inputs and an output, said second NAND gate having its first input connected to the drain of the N-channel transistor and its second input connected to a complement address signal; and a fifth inverter having an input and an output, the input of said fifth inverter being connected to the output of said second NAND gate and the output of said fifth inverter being connected to a redundant element control line in a left plane.

7. A logic circuit as claimed in claim 6, wherein said enable fuse is formed of a polysilicon material, silicide or metal.

8. A logic circuit as claimed in claim 7, wherein said enable fuse is blown by a laser cut.

9. A logic circuit as claimed in claim 6, wherein said disable fuse is formed of a polysilicon material, silicide or metal.

10. A logic circuit as claimed in claim 9, wherein said disable fuse is blown by a laser cut.

11. A logic circuit as claimed in claim 6, wherein said redundant element control line in the right plane is at a high logic level when said enable fuse is blown and the true address signal is at a high logic level.

12. A logic circuit as claimed in claim 6, wherein said redundant element control line in the left plane is at a high potential when said enable fuse is blown and said complement address signal is at a high logic level.

* * * * *